(12) United States Patent
Zhao et al.

(10) Patent No.: US 11,967,662 B2
(45) Date of Patent: Apr. 23, 2024

(54) BACKSIDE EMITTER SOLAR CELL STRUCTURE HAVING A HETEROJUNCTION AND METHOD AND DEVICE FOR PRODUCING THE SAME

(71) Applicant: Meyer Burger (Germany) GmbH, Hohenstein-Ernstthal (DE)

(72) Inventors: Jun Zhao, Port (CH); Marcel Koenig, Chemnitz (DE)

(73) Assignee: Meyer Burger (Germany) GmbH, Hohenstein-Ernstthal (DE)

( * ) Notice: Subject to any disclaimer, the term of this patent is extended or adjusted under 35 U.S.C. 154(b) by 0 days.

(21) Appl. No.: 18/164,779

(22) Filed: Feb. 6, 2023

(65) Prior Publication Data

US 2023/0178672 A1 Jun. 8, 2023

Related U.S. Application Data

(62) Division of application No. 17/633,974, filed as application No. PCT/IB2020/057263 on Jul. 31, 2020, now Pat. No. 11,605,749.

(30) Foreign Application Priority Data

Sep. 5, 2019 (DE) ...................... 10 2019 123 758.8

(51) Int. Cl.
*H01L 31/068* (2012.01)
*H01L 31/0747* (2012.01)
*H01L 31/20* (2006.01)

(52) U.S. Cl.
CPC ...... *H01L 31/0682* (2013.01); *H01L 31/0747* (2013.01); *H01L 31/202* (2013.01)

(58) Field of Classification Search
None
See application file for complete search history.

(56) References Cited

U.S. PATENT DOCUMENTS

| | | |
|---|---|---|
| 2004/0182433 A1 | 9/2004 | Terakawa ............ H01L 31/202 136/258 |
| 2011/0183458 A1 | 7/2011 | Weidman et al. |
| 2012/0085397 A1 | 4/2012 | Kim et al. |
| 2013/0157404 A1 | 6/2013 | Heng et al. |
| 2015/0101659 A1 | 4/2015 | Citarella et al. |
| 2015/0214398 A1 | 7/2015 | Watahiki et al. |

(Continued)

FOREIGN PATENT DOCUMENTS

| | | |
|---|---|---|
| CN | 104380475 A | 2/2015 |
| CN | 104795463 A | 7/2015 |

(Continued)

OTHER PUBLICATIONS

Qin et al. Optoelectronics, vol. 6, No. 2, Mar. 2010, p. 0108. (Year: 2010).

(Continued)

*Primary Examiner* — Eli S Mekhlin
(74) *Attorney, Agent, or Firm* — Laurence A. Greenberg; Werner H. Stemer; Ralph H. Locher (57) ABSTRACT

A backside emitter solar cell structure having a heterojunction, and a method and a device for producing the same. A backside intrinsic layer is first formed on the back side of the substrate, then a frontside intrinsic layer and a frontside doping layer are formed on the front side of the substrate, and finally a backside doping layer is formed on the back side of the substrate.

2 Claims, 5 Drawing Sheets

(56) References Cited

U.S. PATENT DOCUMENTS

| | | |
|---|---|---|
| 2017/0207351 A1 | 7/2017 | Lee et al. |
| 2019/0148579 A1 | 5/2019 | Wang et al. |
| 2020/0313019 A1 | 10/2020 | Ueyama |

FOREIGN PATENT DOCUMENTS

| | | |
|---|---|---|
| CN | 105154852 A | 12/2015 |
| CN | 106601855 A | 4/2017 |
| CN | 109004053 A | 12/2018 |
| CN | 109411551 A | 3/2019 |
| CN | 109461780 A | 3/2019 |
| EP | 169492 A1 | 8/2006 |
| EP | 2682990 A1 | 1/2014 |
| EP | 3997741 A1 | 3/2023 |
| JP | 2001044461 A | 2/2001 |
| JP | 2008192764 A | 8/2008 |
| JP | 2011023759 A | 2/2011 |
| JP | 2014041968 A | 3/2014 |
| JP | 5496856 B2 | 5/2014 |

OTHER PUBLICATIONS

Tomasi, Andrea et al., "Back-Contacted Silicon Heterojunction Solar Cells with Efficiency >21%", IEEE Journal of Photovoltaics, vol. 4, May 14, 2014—Published in English.

Niemela, Lanne-Petteri et al, "Rear-emitter silicon heterojunction solar cells with atomic layer deposited ZnO: Al serving as an alternative transparent conducting oxide to In2O3:Sn", Solar Energy Materials and Solar Cells 200 (2019) 109953, May 23, 2019—Published in English.

Meza, Daniel, "Aluminum-Doped Zinc Oxide as Front Electrode for Rear Emitter Silicon Heterojunction Solar Cells with High Efficiency", applied sciences, Feb. 28, 2019, Appl. Sci. 2019, 9,862; doi: 10.3390/app9050862—Published in English.

Shi, Jianwei et al, "Effects of Amorphous Silicon Thickness Variation on Infrared-Tuned Silicon Heterojunction Bottom Cells", cited on Dec. 12, 2023, On Internet: httos://ieeexolore.ieee.ora/document/8981336—Published in English.

Kim, Sangho, "Improved the efficiency of rear emitter silicon solar cell using an optimized n-type silicon oxide front surface field layer", Scientific Reports, (2018) 8:10657 | DO1:10.1038/s41598-018-28823-x, Published online: Jul. 13, 2018—Published in English.

Bivour Martin et al, "Improving the a-Si:H(p) rear emitter contact of n-type silicon solar cells", Solar Energy Materials & Solar Cells 106 (2012) 11-16, Available online Jul. 13, 2012 at. www.elsevier.com/locate/solmat- Published in English.

Liu Qin et al., "Performance of bifacial HIT solar cells on n-type silicon substrates", Optoelectronics Letters, vol. 6, No. 2, Mar. 1, 2010, DOI 10.l007/sll801-0l0-9183-7—Published in English.

Mertens, Konrad, "Photovoltaik: Lehrbuch zu Grundlagen, Technologie und Praxis" [Photovoltaics: Textbook on Fundamentals, Technology and Practice], Munich: Fachbuchverlag Leipzig im Carl Hanser Verlag, 2019, Edition. 4. ISBN: 978-3-446-44863.—English abstract.

Wagenmann et al, "Photovoltaik: Solarstrahlung und Halbleitereigenschaften, Solarzellenkonzepte und Aufgaben" [Photovoltaics: Solar radiation and semiconductor properties, solar cell concepts and tasks], Wiesbaden: Vieweg + Teubner, 2010, Edition. 2. , ISBN: 978-3-8348-0637-6—English abstract.

Descoeudres et al,, ">21% Efficient Silicon Hererojunction Solar Cellson n-and p-Type Wafers Compared", IEEE Journal of Photovolatics, vol. 3, No. 1, Jan. 1, 2013—Published in English.

BACKSIDE EMITTER SOLAR CELL STRUCTURE HAVING A HETEROJUNCTION AND METHOD AND DEVICE FOR PRODUCING THE SAME

CROSS-REFERENCE TO RELATED APPLICATION

This application is a divisional of patent application Ser. No. 17/633,974, filed Feb. 9, 2022, now U.S. Pat. No. 11,605,749; which was a § 371 national stage filing of international application No. PCT/IB2020/057263, filed Jul. 31, 2020, which designated the United States; this application also claims the priority, under 35 U.S.C. § 119, of German patent application No. DE 10 2019 123 758.8, filed Sep. 5, 2019; the prior applications are herewith incorporated by reference in their entirety.

FIELD AND BACKGROUND OF THE INVENTION

The present invention relates to a method for producing a backside emitter solar cell structure having a heterojunction, wherein
- to form an absorber of the backside emitter solar cell structure, a crystalline semiconductor substrate having a doping of a first conductivity type is provided;
- on a front side of the semiconductor substrate, at least one frontside intrinsic layer is produced from an intrinsic, amorphous semiconductor material;
- on the at least one frontside intrinsic layer, at least one frontside doping layer is produced from an amorphous semiconductor material having a doping of the first conductivity type that is higher than the doping of the semiconductor substrate;
- at least one backside intrinsic layer made of an intrinsic, amorphous semiconductor material is produced on a back side of the semiconductor substrate;
- to form an emitter of the backside emitter solar cell structure on the at least one backside intrinsic layer, at least one backside doping layer is produced from an amorphous semiconductor material having a doping of a second conductivity type, which is opposite to the first conductivity type;
- at least one electrically conductive, transparent frontside conduction layer is produced on the at least one frontside doping layer;
- at least one electrically conductive, transparent backside conduction layer is produced on the at least one backside doping layer;
- a frontside contact is produced on the at least one electrically conductive, transparent frontside conduction layer; and
- a backside contact is produced on the at least one electrically conductive, transparent backside conduction layer.

The invention further relates to a backside emitter solar cell structure having a heterojunction, having
- an absorber made of a crystalline semiconductor substrate having a doping of a first conductivity type;
- at least one frontside intrinsic layer formed on a front side of the absorber made of an intrinsic, amorphous semiconductor material;
- at least one backside intrinsic layer formed on a back side of the absorber made of an intrinsic, amorphous semiconductor material;
- at least one frontside doping layer formed on the at least one frontside intrinsic layer made of an amorphous semiconductor material having a doping of the first conductivity type that is higher than the doping of the absorber;
- an emitter of at least one backside doping layer formed on the at least one backside intrinsic layer and made of an amorphous semiconductor material having a doping of a second conductivity type that is opposite to the first conductivity type;
- at least one electrically conductive, transparent frontside conduction layer formed on the at least one frontside doping layer;
- at least one electrically conductive, transparent backside conduction layer formed on the at least one backside doping layer;
- a frontside contact formed on the at least one electrically conductive, transparent frontside conduction layer, and
- a backside contact formed on the at least one electrically conductive, transparent backside conduction layer.

In addition, the invention relates to a device for producing a backside emitter solar cell structure having a heterojunction, having
- an absorber made of a crystalline semiconductor substrate having a doping of a first conductivity type;
- at least one frontside intrinsic layer formed on a front side of the absorber made of an intrinsic, amorphous semiconductor material;
- at least one backside intrinsic layer formed on a back side of the absorber made of an intrinsic, amorphous semiconductor material;
- at least one frontside doping layer formed on the at least one frontside intrinsic layer made of an amorphous semiconductor material having a doping of the first conductivity type that is higher than the doping of the absorber;
- an emitter of at least one backside doping layer formed on the at least one backside intrinsic layer and made of an amorphous semiconductor material having a doping of a second conductivity type that is opposite to the first conductivity type;
- at least one electrically conductive, transparent frontside conduction layer formed on the at least one frontside doping layer;
- at least one electrically conductive, transparent backside conduction layer formed on the at least one backside doping layer;
- a frontside contact formed on the at least one frontside conduction layer; and
- a backside contact formed on the at least one backside conduction layer.

A method for producing a solar cell having a heterojunction and a frontside emitter is known from publication EP 2 682 990 A1. In the known method, a layer stack consisting of a frontside amorphous intrinsic semiconductor layer and a frontside amorphous doped semiconductor layer is first deposited on a front side of a semiconductor substrate having a doping of a first conductivity type. The frontside amorphous doped semiconductor layer has a doping of a second conductivity type, which is opposite to the first conductivity type. A layer stack consisting of a backside amorphous intrinsic semiconductor layer and a backside amorphous doped semiconductor layer is then deposited on the back side of the semiconductor substrate. The backside amorphous doped semiconductor layer has a doping of the same conductivity type as the semiconductor substrate.

Then a transparent, electrically conductive layer is deposited on the frontside as an anti-reflection layer without structuring and then an electrically conductive backside coating is applied to the back side via a mask, so that the electrically conductive backside coating is not deposited on the layer stack formed on the substrate edge and therefore no electrically conductive layer electrically contacts on the substrate edge. Finally, frontside and backside contacts are created.

This layer application sequence results in a layer sequence having alternating doping on the edge of the substrate side, that is to say an n-p-n$^+$ or a p-n-p$^+$ sequence, each with an antireflection layer thereon. In the document EP 2 682 990 A1 it is pointed out that the layer deposition sequence described must be adhered to in order to achieve advantageous edge insulation in the solar cell to be formed. In particular, the frontside layer stack, which consists of the frontside amorphous intrinsic semiconductor layer and the frontside amorphous doped semiconductor layer, must be deposited in front of the backside layer stack, which consists of the backside amorphous intrinsic semiconductor layer and the backside amorphous doped semiconductor layer, in order to avoid the occurrence of shunt resistance on the solar cell edge.

To avoid undesirable solar cell edge shunts on a frontside emitter solar cell structure having a heterojunction, the document JP 2001044461 A first suggests the layer stack consisting of a backside amorphous intrinsic semiconductor layer and a backside amorphous doped semiconductor layer only in a region that is smaller than the semiconductor substrate area at a distance from the substrate edge. Only then should the layer stack consisting of a frontside amorphous intrinsic semiconductor layer and a frontside amorphous doped semiconductor layer be deposited on the front side of the substrate.

A similar procedure is also described in US 2017/0207351 A1.

SUMMARY OF THE INVENTION

In contrast to the prior art mentioned above, the present invention is based on a heterojunction solar cell structure having a backside emitter. Such solar cells have the advantage over heterojunction solar cells having a frontside emitter that less stringent requirements must be placed on the optoelectric properties of the electrically conductive, transparent frontside conduction layer and on the design of the frontside contact.

In the case of such backside emitter heterojunction solar cells, it is customary in the prior art to first deposit the intrinsic semiconductor layer and the amorphous semiconductor layer doped having the same conductivity type as the semiconductor substrate on the frontside of the substrate intended for incidence of light, and only then to form the intrinsic semiconductor layer and the amorphous semiconductor layer doped differently than the semiconductor on the back side of the substrate.

However, it has been shown that the known shunt resistance and reverse current can assume considerable values in the known backside emitter heterojunction solar cells, and the solar cell characteristic suffers from this.

It is therefore the object of the present invention to improve the electrical solar cell properties of backside emitter heterojunction solar cells.

This object is achieved on the one hand by a method for producing a backside emitter solar cell structure having a heterojunction, in which to form an absorber of the backside emitter solar cell structure, a crystalline semiconductor substrate having a doping of a first conductivity type is provided;

on a front side of the semiconductor substrate, at least one frontside intrinsic layer is produced from an intrinsic, amorphous semiconductor material;

on the at least one frontside intrinsic layer, at least one frontside doping layer is produced from an amorphous semiconductor material having a doping of the first conductivity type that is higher than the doping of the semiconductor substrate;

at least one backside intrinsic layer made of an intrinsic, amorphous semiconductor material is produced on a back side of the semiconductor substrate;

to form an emitter of the backside emitter solar cell structure on the at least one backside intrinsic layer, at least one backside doping layer is produced from an amorphous semiconductor material having a doping of a second conductivity type, which is opposite to the first conductivity type;

at least one electrically conductive, transparent frontside conduction layer is produced on the at least one frontside doping layer;

at least one electrically conductive, transparent backside conduction layer is produced on the at least one backside doping layer;

a frontside contact is produced on the at least one electrically conductive, transparent frontside conduction layer; and a backside contact is generated on the at least one electrically conductive, transparent backside conduction layer, wherein the frontside and backside intrinsic layers and the frontside and backside doping layers are produced in the following order:

Producing the at least one backside intrinsic layer on the backside of the semiconductor substrate;

then producing the at least one frontside intrinsic layer on the frontside of the semiconductor substrate;

then producing the at least one frontside doping layer on the at least one frontside intrinsic layer; and then producing the at least one backside doping layer on the at least one backside intrinsic layer.

Surprisingly, this means that in the method according to the invention, first the intrinsic amorphous semiconductor layer on the backside of the substrate, that is to say the backside intrinsic layer, is produced, then the intrinsic amorphous semiconductor layer and the doped amorphous semiconductor layer on the front side of the substrate and only then the amorphous semiconductor layer doped differently than the semiconductor substrate, that is to say the frontside doping layer on which the front side of the substrate is produced, significantly improves the shunt resistance and the reverse current in all solar cells produced according to the invention. Thermographic measurements have also shown that the leakage current over substrate edges is greatly reduced by the sequence of the method according to the invention. In addition, the quality of the passivation of the solar cells produced according to the invention increases, which is shown in a higher open circuit voltage and a better fill factor of the backside emitter heterojunction solar cells. In addition, the solar cell efficiency is increased by the method according to the invention.

In a preferred variant of the method according to the invention, an n-doped semiconductor substrate is used as the semiconductor substrate, an amorphous semiconductor material doped with phosphorus is used to produce the frontside doping layer, and an amorphous semiconductor material is used to produce the backside doping layer. Since boron diffuses faster than phosphorus and therefore spreads faster than phosphorus in the system for producing the backside emitter solar cell structure having heterojunction, the deposition of the boron-doped backside doping layer as the last layer has a particularly positive effect on the cleanliness of the system in the deposition of the amorphous layers.

In a preferred embodiment of the method according to the invention, the generation of the at least one frontside intrinsic layer on the front side of the semiconductor substrate and the generation of the at least one frontside doping layer on the at least one frontside intrinsic layer are carried out in processes which take place directly in succession in one and the same layer deposition reactor. As a result, only a single layer deposition reactor is required for the production of the frontside intrinsic layer and the frontside doping layer, which overall simplifies and makes the device for producing the backside emitter solar cell structure having heterojunction more economical.

In addition, there is a particularly good edge insulation of the backside emitter solar cell structure having heterojunction produced according to the invention if the at least one electrically conductive, transparent backside conduction layer is deposited on the at least one backside doping layer at a distance from the side edge of the semiconductor substrate, so that an edge region on the backside is not coated with the electrically conductive, transparent backside conduction layer and in all method steps for forming the electrically conductive, transparent backside conduction layer there is no electrical contact between the electrically conductive, transparent backside conduction layer and the frontside conduction layer.

The object is further achieved by a backside emitter solar cell structure having a heterojunction, having
  an absorber made of a crystalline semiconductor substrate having a doping of a first conductivity type;
  at least one frontside intrinsic layer formed on a front side of the absorber made of an intrinsic, amorphous semiconductor material;
  at least one backside intrinsic layer formed on a back side of the absorber made of an intrinsic, amorphous semiconductor material;
  at least one frontside doping layer formed on the at least one frontside intrinsic layer made of an amorphous semiconductor material having a doping of the first conductivity type that is higher than the doping of the absorber;
  an emitter of at least one backside doping layer formed on the at least one backside intrinsic layer and made of an amorphous semiconductor material having a doping of a second conductivity type that is opposite to the first conductivity type;
  at least one electrically conductive, transparent frontside conduction layer formed on the at least one frontside doping layer;
  at least one electrically conductive, transparent backside conduction layer formed on the at least one backside doping layer;
  a frontside contact formed on the at least one electrically conductive, transparent frontside conduction layer, and
  a backside contact formed on the at least one electrically conductive, transparent backside conduction layer, wherein
  on one side edge of the backside emitter solar cell structure having the heterojunction on an edge region of the semiconductor substrate there is a layer sequence in the following sequence from the inside to the outside:
  the at least one backside intrinsic layer,
  thereupon the at least one frontside intrinsic layer,
  thereupon the at least one frontside doping layer and
  thereupon the at least one backside doping layer.

Due to the layer structure on the side edge, i.e. the edge region of the backside emitter solar cell structure, there is a significant improvement in the shunt resistance and the reverse current of the solar cells produced according to the invention compared to backside emitter solar cell structures which have a conventional layer structure on their side edge, in which the layers from inside out are in the following order or overlap in the following order:
  the at least one frontside intrinsic layer,
  thereon the at least one frontside doping layer,
  then the at least one backside intrinsic layer, and
  thereupon the at least one backside doping layer.

In a preferred embodiment of the backside emitter solar cell structure having heterojunction, the semiconductor substrate is an n-doped semiconductor substrate, the frontside doping layer is doped with phosphorus and the backside doping layer is doped with boron.

An advantageous embodiment of the backside emitter solar cell structure having heterojunction is constructed in such a way that the at least one electrically conductive, transparent backside conduction layer is deposited on the at least one backside doping layer at a distance from the side edge of the semiconductor substrate, so that an edge region on the back side is not coated with the electrically conductive, transparent backside conduction layer and there is no electrical contact between the electrically conductive, transparent backside conduction layer and the frontside conduction layer.

The object is also achieved by a device for producing a backside emitter solar cell structure having a heterojunction, having
  an absorber made of a crystalline semiconductor substrate having a doping of a first conductivity type;
  at least one frontside intrinsic layer formed on a front side of the absorber made of an intrinsic, amorphous semiconductor material;
  at least one backside intrinsic layer formed on a back side of the absorber made of an intrinsic, amorphous semiconductor material;
  at least one frontside doping layer formed on the at least one frontside intrinsic layer made of an amorphous semiconductor material having a doping of the first conductivity type that is higher than the doping of the absorber;
  an emitter of at least one backside doping layer formed on the at least one backside intrinsic layer and made of an amorphous semiconductor material having a doping of a second conductivity type that is opposite to the first conductivity type;
  at least one electrically conductive, transparent frontside conduction layer formed on the at least one frontside doping layer;
  at least one electrically conductive, transparent backside conduction layer formed on the at least one backside doping layer;
  a frontside contact formed on the at least one frontside conduction layer; and a backside contact formed on the at least one backside conduction layer, wherein the device for producing the at least one frontside intrinsic layer on the front side of the semiconductor substrate, the at least one backside intrinsic layer on the back side of the semiconductor substrate, the at least one frontside doping layer on the at least one frontside intrinsic layer and the at least one backside doping layer on the at least one backside intrinsic layer has only three layer deposition strands, wherein a first layer deposition strand has at least one layer deposition reactor for producing the at least one backside intrinsic layer on the back side of the semiconductor substrate;

a second layer deposition strand has at least one layer deposition reactor for producing the at least one frontside intrinsic layer on the front side of the semiconductor substrate and for producing the at least one frontside doping layer on the at least one frontside intrinsic layer; and a third layer deposition strand has at least one layer deposition reactor for producing the at least one backside doping layer on the at least one backside intrinsic layer;

and wherein at least one substrate transport and turning system is provided between the first and second layer deposition strands and between the second and third layer deposition strands.

In contrast to the prior art, in the device according to the invention, the semiconductor substrate first passes through the first layer deposition strand having the at least one layer deposition reactor for producing the at least one backside intrinsic layer, is then turned over, only after that the second layer deposition strand having the at least one layer deposition reactor for producing the at least one frontside intrinsic layer fed to the frontside of the semiconductor substrate and for producing the at least one frontside doping layer on the at least one frontside intrinsic layer, then turned over again and only finally transported into the third layer deposition strand having the at least one layer deposition reactor for producing the at least one backside doping layer on the at least one backside intrinsic layer.

In a preferred embodiment of the device according to the invention, the first layer deposition strand has a backside intrinsic layer deposition reactor for producing the at least one backside intrinsic layer on the back side of the semiconductor substrate; the second layer deposition strand has a single frontside layer deposition reactor for producing the at least one frontside intrinsic layer on the frontside of the semiconductor substrate and the at least one frontside doping layer on the at least one frontside intrinsic layer; and the third layer deposition strand has a backside doping deposition reactor for producing the at least one backside doping layer on the at least one backside intrinsic layer; and the at least one substrate transport and turning system is provided upstream of the frontside layer deposition reactor before or in the second layer deposition strand.

Preferred embodiments of the present invention are explained in more detail below with reference to figures, wherein

DETAILED DESCRIPTION OF THE INVENTION

Figure 1A:
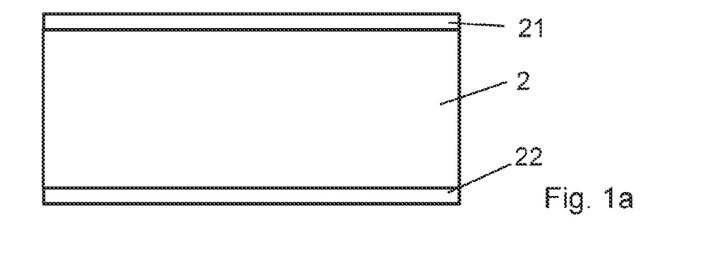
FIGS. 1a to 1i: schematically represent partial steps of a process sequence of an embodiment of the method according to the invention for producing a backside emitter solar cell structure having heterojunction using cross-sectional views of the layer sequence generated in each case.
Figure 1B:
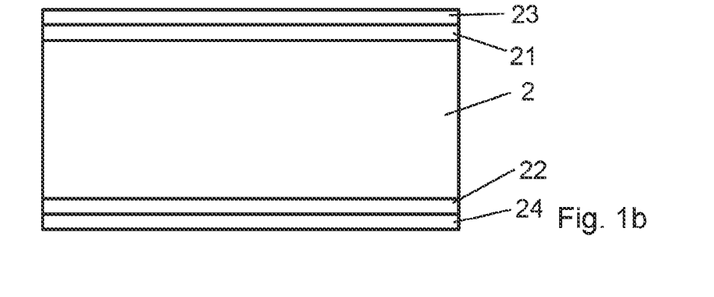
Figure 1C:
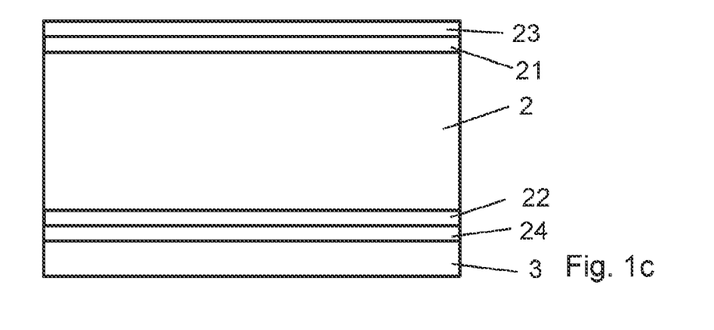
Figure 1D:
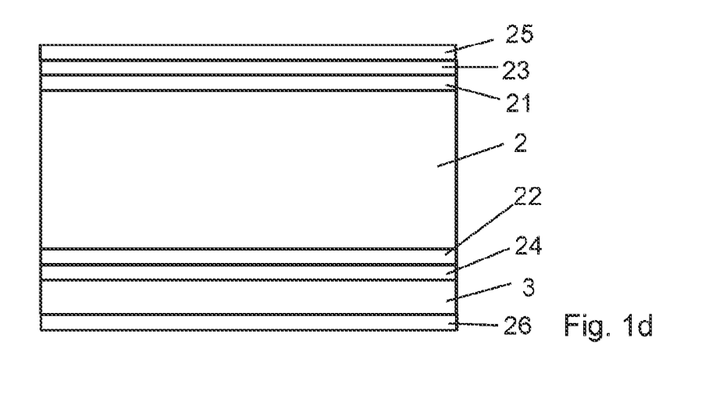
Figure 1E:
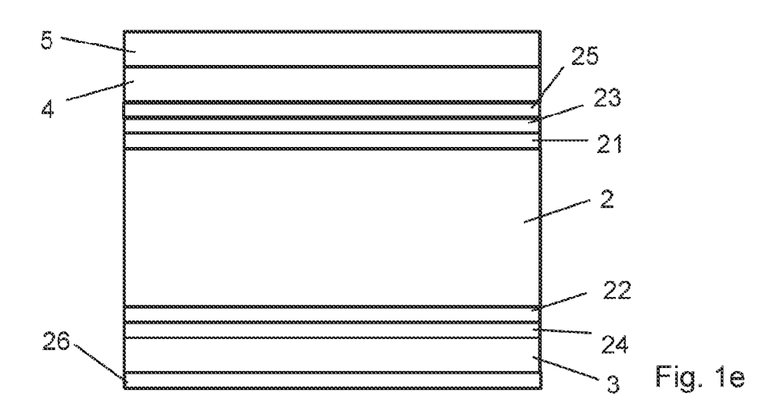
Figure 1F:
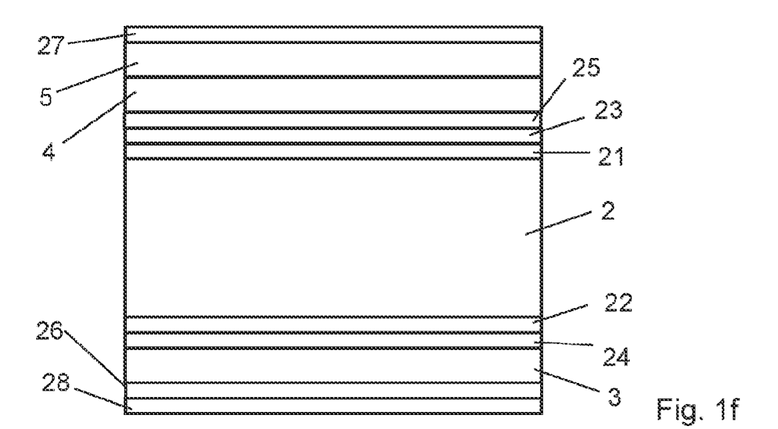
Figure 1G:
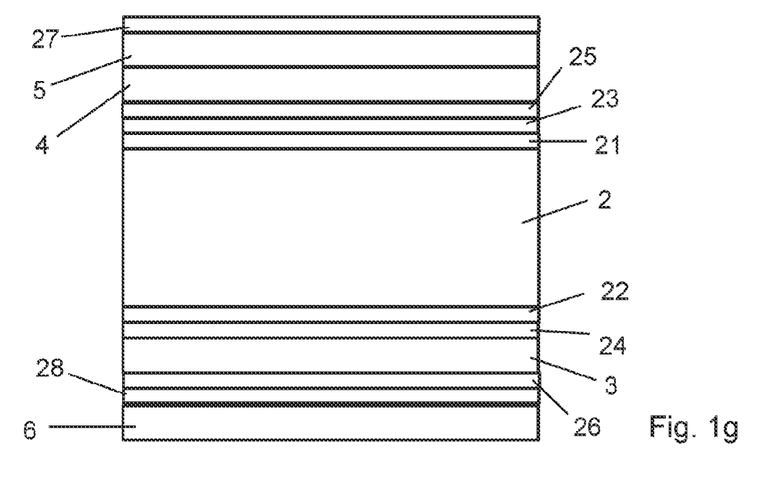
Figure 1H:
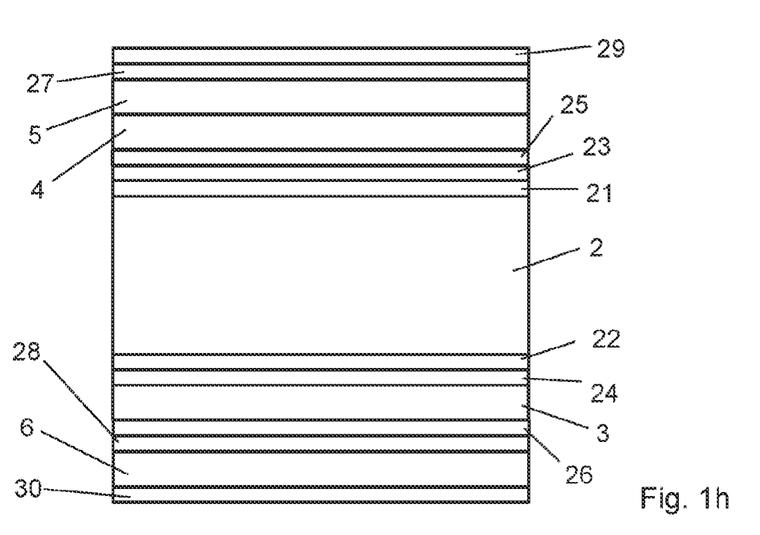
Figure 1I:
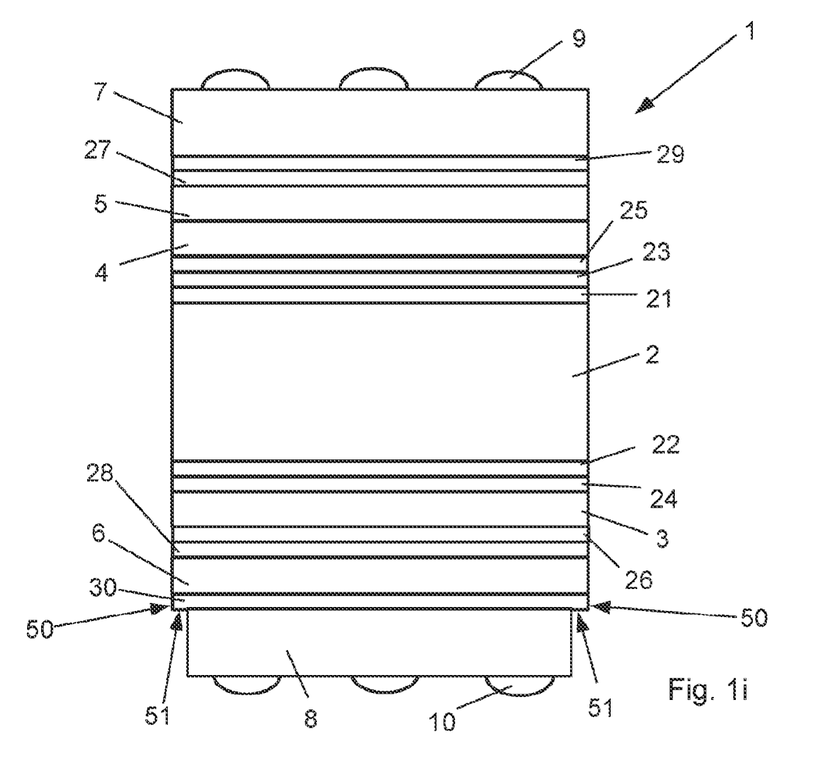

FIG. 1a to 1i schematically show partial steps of a process sequence of an embodiment of the method according to the invention for producing a backside emitter solar cell structure 1 having a heterojunction, as is shown schematically in cross-section, for example, in FIG. 1i, using cross-sections of each layer sequence produced. The layer thicknesses of the layers shown in the individual figures are not shown to scale. Although the ratio of the respective layer thicknesses to one another is also not shown to scale, if one layer is shown thinner than another, this is typically also thinner in reality.

In the figures, the side of the respective layer structure shown above is the front side and the side shown below is the back side of the respective layer structure. The front side is the side into which light is provided in the finished backside emitter solar cell structure 1.

FIG. 1a schematically shows a crystalline semiconductor substrate 2, on the front side and back side of which air oxide layers 21, 22 are formed. The semiconductor substrate 2 has a doping of a first conductivity type. In the exemplary embodiment shown, the semiconductor substrate 2 is an n-doped silicon substrate, but in other embodiments of the invention can also be formed from another semiconductor material and/or have a p-type doping. The n-doping is preferably a phosphorus doping, but can also be formed with at least one other and/or at least one additional dopant.

The air oxide layers 21, 22 in the example shown are $SiO_2$ layers having a thickness between 0.2 and 3.0 nm.

The air oxide layers 21, 22 automatically form in the atmosphere on the previously cleaned semiconductor substrate 2. The semiconductor substrate 2 forms an absorber in the finished backside emitter solar cell structure 1.

Figure 3:
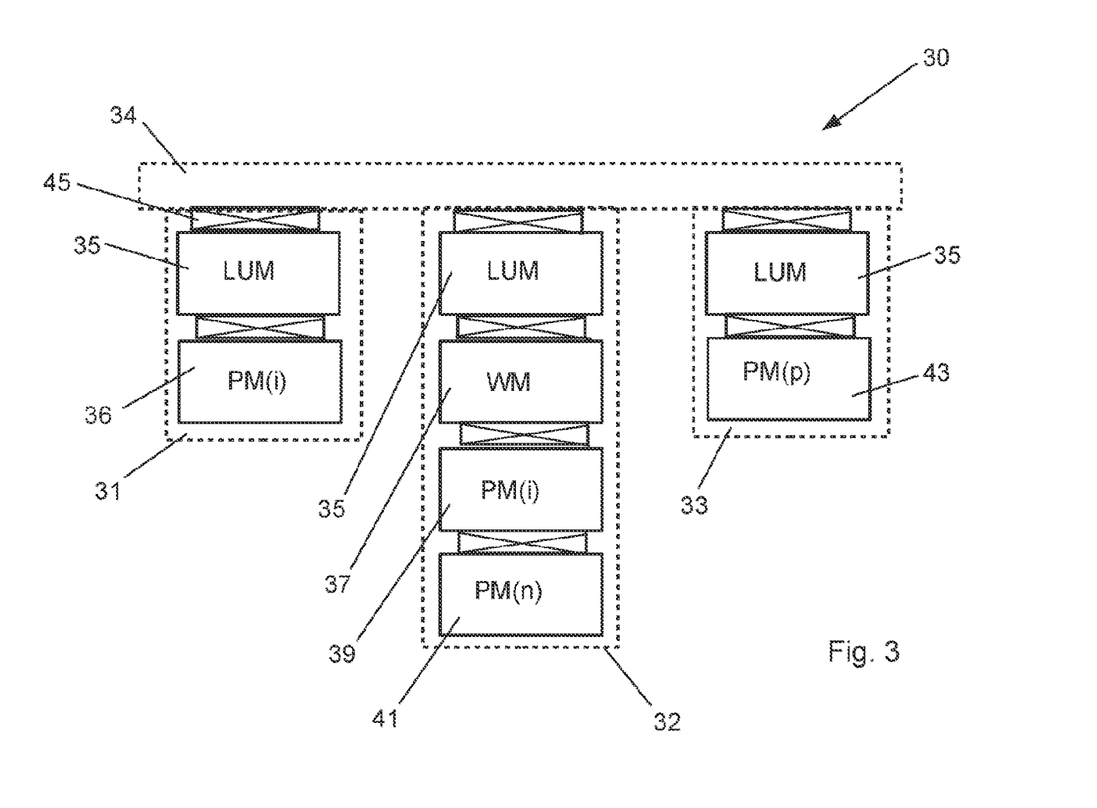
FIG. 3 schematically shows a possible basic structure of a partial region of a device according to the invention for producing backside emitter solar cell structures having a heterojunction.
Figure 4:
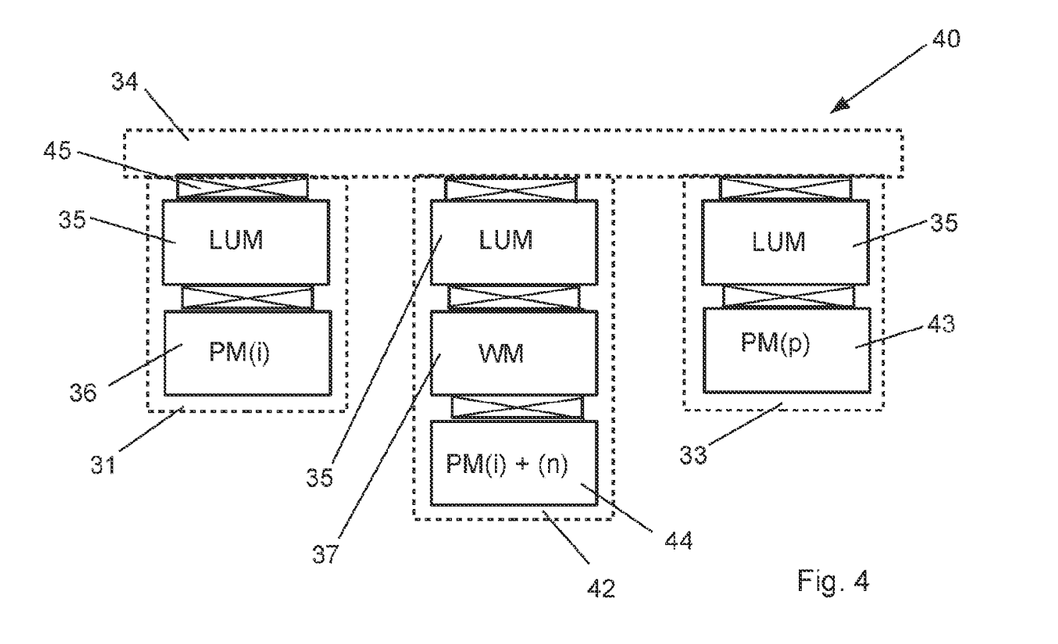
FIG. 4 schematically shows a further possible basic structure of a partial region of the device according to the invention for producing backside emitter solar cell structures having a heterojunction.

FIG. 1b shows the semiconductor substrate 2 from FIG. 1a after a further method step, in which the semiconductor substrate 2 is loaded into a device for producing backside emitter solar cell structures 1 having heterojunction. Portions of examples of such devices 30, 40 are shown in FIGS. 3 and 4.

During charging, both sides of the semiconductor substrate 2 are exposed to the atmosphere at temperatures of typically below 200° C., so that air oxide layers 23, 24, that is to say here $SiO_2$ layers having a thickness of 0.2 to 3.0 nm, again form on the front side and the back side of the semiconductor substrate 2 or the air oxide layers 21, 22 grow by the thickness of the air oxide layers 23, 24.

In a further process step of the method according to the invention, shown schematically in FIG. 1c, at least one backside intrinsic layer 3 made of an intrinsic, amorphous semiconductor material is deposited on the back side of the semiconductor substrate 2 having the air oxide layers 21, 22, 23, 24. The at least one backside intrinsic layer 3 is preferably deposited using a PECVD method.

In the step shown in FIG. 1*d*, by transporting and turning the layer structure from FIG. 1*c* to the next layer deposition reactor, air oxide layers 25, 26 are in turn formed on the front side and back side of the layer structure from FIG. 1*c*. The air oxide layers 25, 26 in the example shown are $SiO_2$ layers having a thickness of 0.2 to 3.0 nm. The air oxide layer 25 grows directly on the air oxide layers 21, 23 that already exist on the front side. The air oxide layer 26 grows on the deposited backside intrinsic layer 3.

After the backside intrinsic layer 3 has been deposited, at least one frontside intrinsic layer 4 made of at least one amorphous intrinsic semiconductor material and at least one frontside doping layer 5 made of at least one amorphous semiconductor material having a doping of the first conductivity type which is higher than the doping of the semiconductor substrate 2, are deposited on the front side of the semiconductor substrate 2 with the layers 21, 23, 25 thereon. This can be seen in FIG. 1*e*. Since the semiconductor substrate 2 is n-doped in the exemplary embodiment shown, the frontside doping layer 5 is also n-doped, preferably doped with phosphorus.

The frontside intrinsic layer 4 can be deposited separately from the frontside doping layer 5 in different layer deposition reactors. However, it is particularly advantageous if, as has been done in the exemplary embodiment shown, the frontside doping layer 5 is deposited directly after the frontside intrinsic layer 4 in one and the same layer deposition reactor without intermediate substrate handling. In this case, formation of air oxide between the frontside intrinsic layer 4 and the frontside doping layer 5 is avoided.

In the case of the substrate handling required after this layer deposition or these layer depositions, during which a substrate transport to the next layer deposition reactor takes place and the substrate is turned again, the layer structure produced and shown schematically in FIG. 1*e* again reaches the atmosphere, which in turn causes air oxide layers 27, 28 on both sides of the layer structure grow, which is shown in FIG. 1*f*. The air oxide layers 27, 28 in the exemplary embodiment are $SiO_2$ layers having a layer thickness between 0.2 and 3.0 nm.

After a further substrate handling, a backside doping layer 6 is produced from an amorphous semiconductor material having a doping of a second conductivity type, which is opposite to the first conductivity type, on the back side of the layer arrangement shown in FIG. 1*f*. This is shown in FIG. 1*g*. In the exemplary embodiment shown, the backside doping layer 6 is a p-doped, amorphous silicon layer. Specifically, the p-type doping used in the example is a boron-type doping, but can be a different doping in other exemplary embodiments of the invention. The backside doping layer 6 forms the electrical contacting provided thereon, which is described below, and forms the emitter of the backside emitter solar cell structure 1 to be formed having a heterojunction.

The layer structure from FIG. 1*g* is subsequently transported to at least one further layer deposition reactor, the layer structure being again exposed to atmospheric conditions during the transport. Approximately 0.2 to 3.0 nm thin air oxide layers 29, 30 are again formed on the front side and the back side of the layer structure, which can be seen in FIG. 1*h*.

Thereafter, as is shown schematically in FIG. 1*i*, electrically conductive, transparent frontside and backside conduction layers 7, 8 are produced on the front side and the back side of the layer structure from FIG. 1*h*. The electrically conductive, transparent frontside and backside conduction layers 7, 8 preferably consist of electrically conductive, transparent oxide (TCO). In the exemplary embodiment shown, the electrically conductive, transparent frontside and backside conduction layers 7, 8 are indium tin oxide layers (ITO layers).

In the exemplary embodiment shown, the electrically conductive, transparent backside conduction layer 8 is deposited on the at least one backside doping layer 6 at a distance from the side edge 50 of the semiconductor substrate 2. The backside doping layer 6 can be deposited, for example, via a mask. As a result, an edge region 51 on the back side of the backside emitter solar cell structure 1 having a heterojunction from the electrically conductive, transparent backside conductor layer 8 remains uncoated. Due to the structured deposition, there is no electrical contact between the electrically conductive, transparent backside conduction layer 8 and the frontside conduction layer 7, not even during the deposition of the electrically conductive, transparent backside conduction layer 8.

Finally, frontside and backside contacts 9, 10 are produced on the electrically conductive, transparent frontside and backside conduction layers 7, 8, respectively. In the exemplary embodiment shown, the frontside and backside contacts 9, 10 are made of silver and are provided in finger shape on the front side and back side of the solar cells. However, they can also be formed from another, electrically conductive material and/or applied in a different form.

As can be seen from the above statements, with each substrate transport air oxide layers 21, 22, 23, 24, 25, 26, 27, 28, 29, 30 arise, which form barriers between the semiconductor substrate 2 and the intrinsic layers 3, 4 deposited thereon, between the backside intrinsic layer 4 and the backside doping layer 6 as well as between the frontside and backside doping layers 5, 6 and the respectively frontside and backside conduction layers 7, 8 deposited thereon. These barriers hinder the conductor carrier transport and thus deteriorate the solar cell properties of the backside emitter solar cell structure 1 to be formed having a heterojunction. As described above, by depositing the frontside doping layer 5 directly after the frontside intrinsic layer 4 in the same layer deposition reactor, such a barrier formation between the frontside intrinsic layer 4 and the frontside doping layer 5 could be avoided.

Furthermore, the process step sequence according to the invention, in which the boron-doped backside doping layer 6 is deposited as the last of the amorphous semiconductor layers, limits the outdiffusion of boron, which has a higher diffusion coefficient than the phosphorus contained in the frontside doping layer 5, from the backside doping layer 6 to a minimum. This also advantageously influences the solar cell properties of the backside emitter solar cell structure 1 to be formed having a heterojunction.

Figure 2:
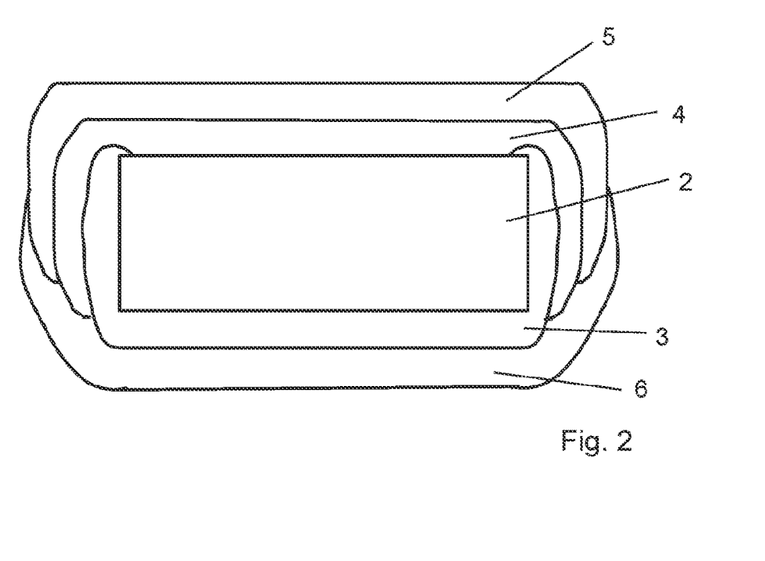
FIG. 2 schematically shows a layer stack formed on a side edge of an intermediate product of a backside emitter solar cell structure having heterojunction according to the invention after the formation of the intrinsic and amorphous semiconductor layers.

As can be seen schematically in FIG. 2, the procedure according to the invention also has further advantageous effects. FIG. 2 schematically shows an intermediate product of the backside emitter solar cell structure 1 according to the invention having a heterojunction from FIG. 1*i*. While in FIGS. 1*a* to 1*i* the layer sequences forming at the solar cell edge have been omitted for the sake of clarity, this layer sequence is shown in FIG. 2 after the amorphous semiconductor layers 3, 4, 5 and 6 have been deposited and before the formation of the further layers 7, 8, 9, 10 particularly large.

Starting from the n-doped semiconductor substrate 2 in the illustrated embodiment, a n-i-i-n$^+$-p layer sequence results at the edge of the solar cell. In contrast, in the prior art, the conventional process sequence results in an n-i-n$^+$-i-p layer sequence. The double intrinsic layer 3, 4 on the edge or on the side edge of the semiconductor substrate 2 seems to protect the formed structure particularly against the formation of shunt resistances and leakage currents at the edge of the solar cell.

FIGS. 3 and 4 schematically show partial areas of possible system concepts or devices 30, 40 for the production of backside emitter solar cell structures 1 having a heterojunction, as described above. The device 30, which is shown schematically in regions in FIG. 3, and the device 40, which is shown in regions in FIG. 4, each have three layer deposition strands 31, 32 and 42, 33 for the formation of the amorphous semiconductor layers 3, 4, 5, 6.

In a first layer deposition strand 31, at least one layer deposition reactor 36 is provided for producing the at least one backside intrinsic layer 3 on the back side of the semiconductor substrate 2.

In a second layer deposition strand 32 or 42, there is at least one layer deposition reactor 39, 41; 44 for producing the at least one frontside intrinsic layer 4 on the front side of the semiconductor substrate 2 and for producing the at least one frontside doping layer 5 on the at least one frontside intrinsic layer 4. In the device 40, the second layer deposition strand 42 has only a single frontside layer deposition reactor 44 for producing the at least one frontside intrinsic layer 4 on the front side of the semiconductor substrate 2 and the at least one frontside doping layer 5 on the at least one frontside intrinsic layer 4.

In a third layer deposition strand 33, at least one layer deposition reactor 43 is provided for producing the at least one backside doping layer 6 on the at least one backside intrinsic layer 3.

A substrate transport and turning system 37 is provided in each case between the first layer deposition strand 31 and the second layer deposition strand 32 or 42 and between the second layer deposition strand 32 or 42 and the third layer deposition strand 33. In the devices 30, 40, only a single substrate transport and turning system 37 is provided, which is located in front of the frontside layer deposition reactor(s) 39, 41 and 44, respectively.

A lock device 45 is provided between and in front of the individual layer deposition reactors.

A loading and unloading device 35 is provided at the beginning of each layer deposition strand 31, 32 and 42, 33.

The invention claimed is:

1. A device for producing a backside emitter solar cell structure with a heterojunction,
   wherein the solar cell structure includes:
   an absorber made of a crystalline semiconductor substrate having a doping of a first conductivity type;
   at least one frontside intrinsic layer formed on a front side of the absorber and made of an intrinsic, amorphous semiconductor material;
   at least one backside intrinsic layer formed on a back side of the absorber and made of an intrinsic, amorphous semiconductor material;
   at least one frontside doping layer formed on the at least one frontside intrinsic layer from an amorphous semiconductor material having a doping of the first conductivity type which is higher than the doping of the absorber;
   an emitter of at least one backside doping layer formed on the at least one backside intrinsic layer and made of an amorphous semiconductor material having a doping of a second conductivity type, which is opposite to the first conductivity type;
   at least one electrically conductive, transparent frontside conduction layer formed on the at least one frontside doping layer;
   at least one electrically conductive, transparent backside conduction layer formed on the at least one backside doping layer;
   a frontside contact formed on the at least one frontside conduction layer; and
   a backside contact formed on the at least one backside conduction layer; and
   the device for producing the backside emitter solar cell structure comprising:
   no more than three layer deposition strands for producing the at least one frontside intrinsic layer on the front side of the semiconductor substrate, the at least one backside intrinsic layer on the back side of the semiconductor substrate, the at least one frontside doping layer on the at least one frontside intrinsic layer, and the at least one backside doping layer on the at least one backside intrinsic layer;
   said layer deposition strands including a first layer deposition strand having at least one layer deposition reactor for producing the at least one backside intrinsic layer on the back side of the semiconductor substrate;
   said layer deposition strands including a second layer deposition strand having at least one layer deposition reactor for producing the at least one frontside intrinsic layer on the front side of the semiconductor substrate and for producing the at least one frontside doping layer on the at least one frontside intrinsic layer; and
   said layer deposition strands including a third layer deposition strand having at least one layer deposition reactor for producing the at least one backside doping layer on the at least one backside intrinsic layer; and
   at least one substrate transport and turning system between said first and second layer deposition strands and between said second and third layer deposition strands.

2. The device according to claim 1, wherein:
   said first layer deposition strand has a backside intrinsic layer deposition reactor for producing the at least one backside intrinsic layer on the back side of the semiconductor substrate;
   the second layer deposition strand has a single frontside layer deposition reactor for producing the at least one frontside intrinsic layer on the frontside of the semiconductor substrate and the at least one frontside doping layer on the at least one frontside intrinsic layer;
   the third layer deposition strand has a backside doping layer deposition reactor for producing the at least one backside doping layer on the at least one backside intrinsic layer; and
   the at least one substrate transport and turning system is disposed upstream of said frontside layer deposition reactor before or in said second layer deposition strand.

* * * * *